(12) United States Patent
Singh

(10) Patent No.: US 8,461,858 B1
(45) Date of Patent: Jun. 11, 2013

(54) ADJUSTABLE POWER SUPPLY SAG AND BOUNCE GENERATOR

(75) Inventor: Preminder Singh, Fremont, CA (US)

(73) Assignee: Altera Corporation, San Jose, CA (US)

( * ) Notice: Subject to any disclaimer, the term of this patent is extended or adjusted under 35 U.S.C. 154(b) by 1147 days.

(21) Appl. No.: 12/333,270

(22) Filed: Dec. 11, 2008

(51) Int. Cl.
*G01R 31/26* (2006.01)

(52) U.S. Cl.
USPC .................................... 324/762.01

(58) Field of Classification Search
USPC .. 324/762.01–762.1, 750.01–750.3; 714/724, 714/726; 257/48; 438/14–18
See application file for complete search history.

(56) References Cited

U.S. PATENT DOCUMENTS

| | | | |
|---|---|---|---|
| 5,438,259 A * | 8/1995 | Orihashi et al. ......... | 324/762.02 |
| 5,886,429 A | 3/1999 | Grady | |
| 5,939,780 A * | 8/1999 | Inoue ............................. | 257/692 |
| 7,218,122 B1 | 5/2007 | Nastasi | |
| 7,289,342 B2 | 10/2007 | D'Cunha | |
| 7,359,811 B1 | 4/2008 | Liu | |
| 7,492,220 B2 * | 2/2009 | Chiu et al. ...................... | 330/10 |

\* cited by examiner

*Primary Examiner* — Tung X Nguyen
(74) *Attorney, Agent, or Firm* — Treyz Law Group; Nancy Y. Ru

(57) ABSTRACT

Adjustable positive voltage sag circuitry and adjustable ground bounce circuitry are provided for testing portions of integrated circuits. Adjustable positive voltage sag circuitry and adjustable ground bounce circuitry may provide positive power supply voltages with periodic sags and ground power supply voltages with periodic bounces to test a circuit under test. This may mimic a situation in which a circuit under test is surrounded by devices that switch simultaneously and consume power. Adjustable positive voltage sag circuitry and adjustable ground bounce circuitry allow for a circuit under test to be tested for robustness under such non-ideal power supply conditions.

21 Claims, 11 Drawing Sheets

ADJUSTABLE POWER SUPPLY SAG AND BOUNCE GENERATOR

BACKGROUND

This invention relates to adjustable power supply voltage sag generators and ground supply voltage bounce generators for testing the effects of positive power supply sag and ground power supply bounce on integrated circuit performance.

If an integrated circuit contains a significant number of digital circuit devices that switch simultaneously, the value of the ground power supply voltage may rise (bounce) and the value of the positive power supply voltage may drop (sag) momentarily at the time of switching. Power supply sag and bounce may be significant enough to affect the performance of devices in the integrated circuit.

When designing an integrated circuit, it may be desirable to test the functionality of portions of the integrated circuit before they are incorporated into the complete design. Testing may save time and cost by exposing design issues early on in the development cycle. In particular, it may be desirable to test how a circuit block would perform if it were incorporated into an integrated circuit that suffers from power supply bounce and sag resulting from simultaneous switching effects.

Programmable logic device manufacturers sometimes program integrated circuits so that a particular circuit block of interest is surrounded with numerous devices that switch simultaneously. The manufacturer may then measure the performance of the circuit block under these high-stress conditions. However, this testing technique does not deliver quantifiable and easily tunable power supply sags and bounces to the circuit block and relies on the availability of programmable circuit resources in the vicinity of the circuit block of interest. Attempts to avoid the need to perform this type of test measurement using simulations have proven difficult, because the required computations are complex and involve long run times.

Nevertheless, as semiconductor technology advances, integrated circuits are increasingly being powered with lower positive power supply voltages. This may make it more likely for integrated circuits to suffer from power supply sag and bounce issues if they are not carefully designed. Testing the effects of power supply sag and bounce on integrated circuits during the design process is therefore of growing importance.

SUMMARY

In accordance with the present invention, adjustable positive power supply voltage sag generators ("adjustable voltage sag generators") and adjustable ground power supply voltage bounce generators ("adjustable ground bounce generators") are provided for use in testing integrated circuits during the integrated circuit design process.

A test integrated circuit ("test chip") may be provided that contains adjustable voltage sag and ground bounce generators as well as a circuit under test (CUT).

Adjustable voltage sag generators may be used create momentary dips or sags in a positive power supply voltage of a circuit under test. Adjustable voltage sag generators may be programmed or controlled in real time to produce voltage sags of varying phase, width, and magnitude.

Adjustable ground bounce generators may be used to create momentary bounces in a ground power supply voltage of a circuit under test. Adjustable ground bounce generators may be programmed or controlled in real time to produce sags of varying phase, width, and magnitude.

Testing equipment may be provided for evaluating the performance of the circuit under test while adjustable sag and ground bounce generators are producing sags and bounces in the power supply of the circuit under test. The testing equipment may be used to provide control and configuration signals to the adjustable sag and ground bounce generators.

Further features of the invention, its nature, and various advantages will be more apparent from the accompanying drawings and the following detailed description.

DETAILED DESCRIPTION

The present invention relates to adjustable positive power supply voltage sag generator circuitry ("adjustable voltage sag generator") and an adjustable ground power supply voltage bounce generator circuitry ("adjustable ground bounce generator").

Adjustable positive power supply voltage sag generators and adjustable ground bounce generators may be used to test circuitry on an integrated circuit. The circuitry that is being tested is sometimes referred to as a circuit block or a circuit under test (CUT). Adjustable positive voltage sag generators may be used create momentary dips or sags in a positive power supply voltage of a circuit under test. Adjustable ground bounce generators may be used to create momentary bounces in a ground power supply voltage of a circuit under test. Real time (dynamic) control signals or static control signals produced by programmable elements may be used to control the magnitudes of the positive voltage sags and ground bounces that are produced.

A circuit under test may be located on an integrated circuit chip. Adjustable positive voltage sag and ground bounce generators may be located on the same integrated circuit chip as the circuit under test, or they may be located external to the integrated circuit chip containing the circuit under test. If adjustable positive voltage sag and ground bounce generators are located on the same integrated circuit chip as the circuit under test, adjustable positive voltage sag and ground bounce generators may be deactivated before the integrated circuit chip is put into use or shipped to customers. Adjustable positive voltage sag and ground bounce generators may also be located with the circuit under test on a special "test chip" that is used only for testing purposes during an integrated circuit design process.

Figure 1:
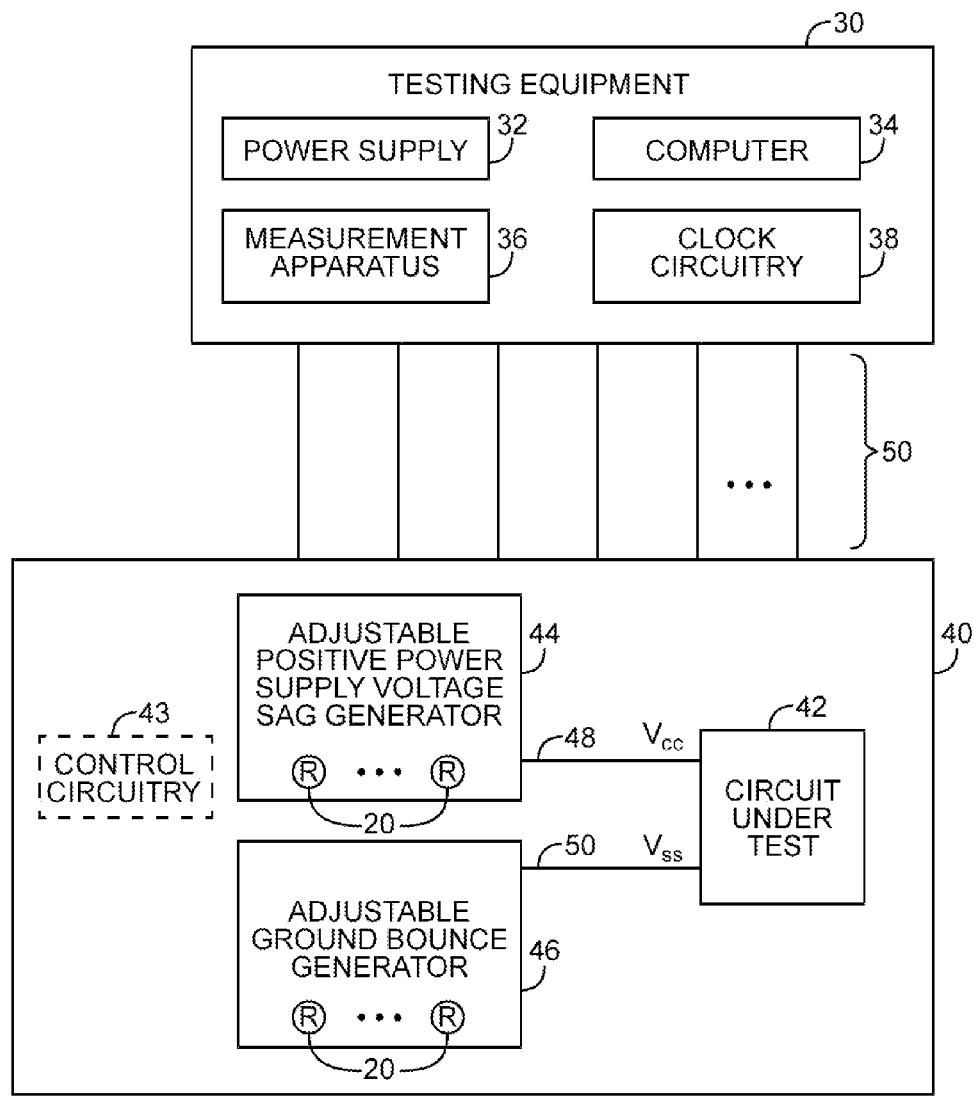
FIG. 1 is a diagram showing testing equipment and an integrated circuit containing an adjustable positive power supply voltage sag generator, an adjustable ground sag generator, and a circuit under test in accordance with an embodiment of the present invention.

Such a test chip 40 is shown in the diagram of FIG. 1. Test chip 40 contains circuit under test 42. Circuit under test 42 may be any integrated circuit or portion of an integrated circuit. Circuit under test 42 may be implemented using hardwired circuitry or may contain programmable logic that is programmed (e.g. by configuration data loaded from testing equipment 30).

Adjustable positive voltage sag generator 44 may be connected to Vcc positive power supply voltage terminal 48 of circuit under test 42. Adjustable positive voltage sag generator 44 may be capable of producing momentary sags in positive voltage Vcc. Positive voltage Vcc on path 48 may, for example, have a nominal value of 1 volt that is interrupted by sags that momentarily decrease Vcc to 0.7 volt. Sags may be produced at intervals determined by a clock signal.

Adjustable ground bounce generator 46 may be connected to Vss ground power supply voltage terminal 50 of circuit under test 42. Adjustable ground bounce generator 46 may be capable of producing momentary bounces in Vss. Ground voltage Vss may, for example, have a nominal value of 0 volt that momentarily bounces to 0.3 volt. Bounces may be produced at intervals determined by a clock signal.

Adjustable positive voltage sag generator 44 and adjustable ground bounce generator 46 may be programmed by loading programmable elements 20 with suitable configuration data or may be otherwise controlled to specify the phase, pulse width, or pulse magnitude of sags and bounces. Optional control circuitry 43 may be provided on test chip 40 to control or configure adjustable positive voltage sag generator 44 and adjustable ground bounce generator 46.

Testing equipment 30 may be connected to test chip 40 by conductive path 50. Testing equipment 30 may contain power supply 32, computer 34, measurement apparatus 36, and clock circuitry 38. Testing equipment 30 may provide positive power supply voltages, ground power supply voltages, and clock signals to test chip 40 along path 50. Testing equipment 30 may also provide control signals and configuration data signals to adjustable positive voltage sag generator 44 and adjustable ground bounce generator 46. If circuit under test 42 contains programmable logic, testing equipment 30 may provide test configuration data to circuit under test 42 to configure circuit under test 42 for testing. Testing equipment 30 may be used to measure the performance of circuit under test 42 while adjustable positive voltage sag generator 44 and adjustable ground bounce generator 46 are producing sags and bounces in the Vcc and Vss power supply voltages of circuit under test 42. For example, testing circuitry 30 may apply test vectors to circuit under test 42 while monitoring test results.

Figure 2:
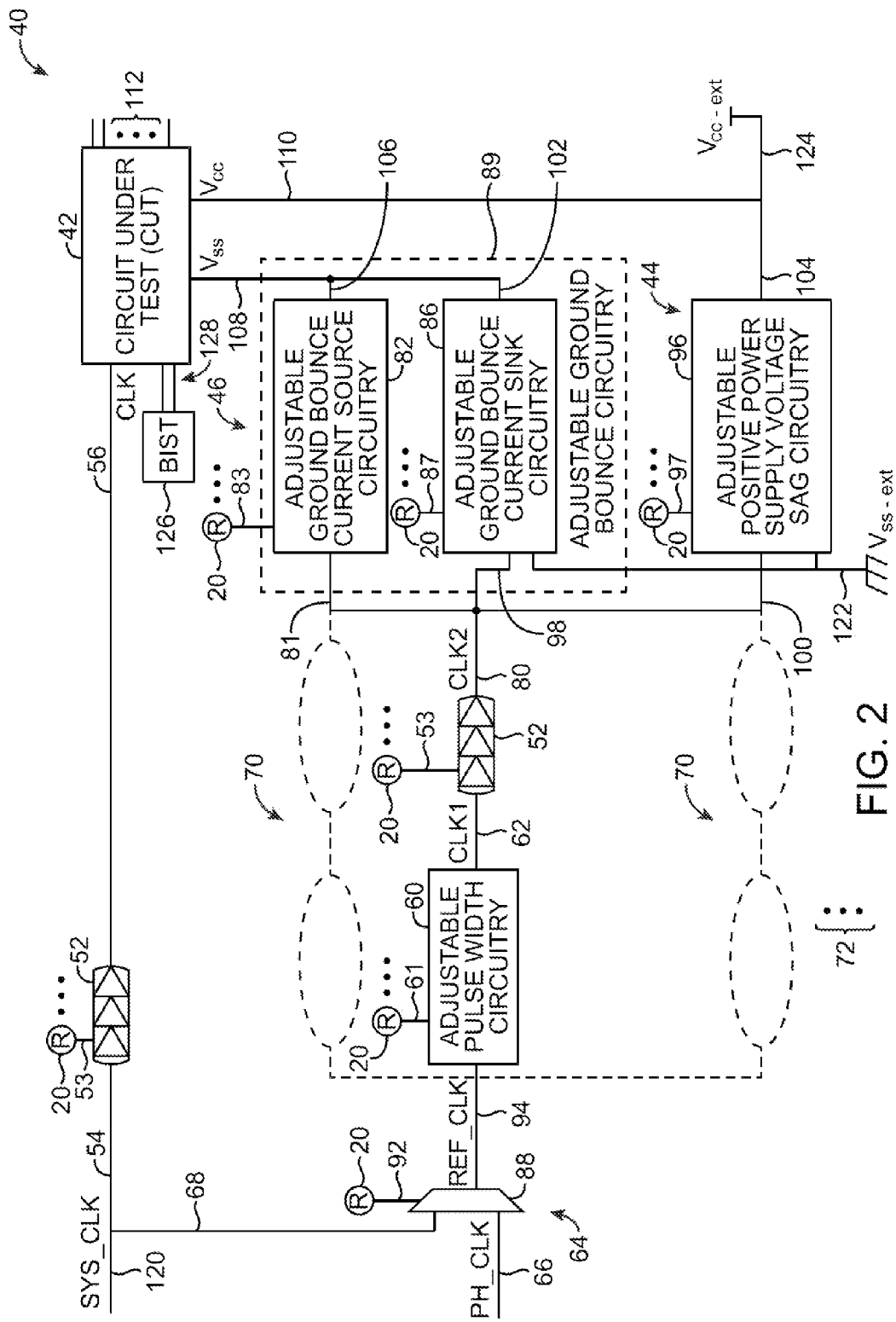
FIG. 2 is a circuit diagram showing adjustable positive power supply voltage sag and ground bounce generators and a circuit under test in accordance with an embodiment of the present invention.

A configuration that may be used for test chip 40 is shown in the circuit diagram of FIG. 2. Test chip 40 in FIG. 2 may contain circuit under test 42. Circuit under test 42 may be any suitable circuitry for which test results are desired (e.g., memory circuitry, processing circuitry, communications circuitry, general purpose logic, etc.)

Circuit under test 42 may have positive power supply voltage Vcc terminal 108 and ground power supply voltage Vss terminal 110. Circuit under test 42 may have a clock terminal 56 that receives a clock signal CLK. Control or configuration signals may be provided to circuit under test 42 using control paths 112. Such signals may be provided by testing equipment 30 (see, e.g., FIG. 1) and may include configuration data if circuit under test 42 contains programmable logic. If desired, built in self test block (BIST) 126 may be provided for assisting in tests of circuit under test 42. BIST 126 may be connected to circuit under test 42 by path 128. If circuit under test 42 contains memory cells, BIST circuitry 126 may be used to test the function of these memory cells. BIST circuitry 126 may be hardwired or may be implemented using programmable logic.

Test chip 40 may receive clock signal SYS_CLK on terminal 120 from an external source such as testing equipment 30 on FIG. 1. Clock signal SYS_CLK may have a frequency of 400 MHz (as an example). Adjustable delay chain 52 may receive clock signal SYS_CLK and may be used to add a phase delay (time delay) to clock signal SYS_CLK. Adjustable delay chain 52 may receive control signals on control path 53 that specifies the degree of phase delay, or no phase delay, to be added to SYS_CLK. The control signals may originate from control circuitry 43 of FIG. 1, testing equipment 30 of FIG. 1 or programmable elements such as programmable element 20. Adjustable delay chain 52 may supply clock signal CLK to terminal 56 of circuit under test 42. The clock signal CLK supplied to circuit under test 42 may therefore have a different phase from the clock signal SYS_CLK that is supplied to test chip 40, allowing flexibility during testing.

A phase clock signal PH_CLK may be provided on terminal 66 from an external source such as testing equipment 30 of FIG. 1. The clock rate of signal PH_CLK may be a higher multiple (e.g., twice, three times, etc.) of the clock rate of SYS_CLK, or the clock rate of PH_CLK may be a fraction (e.g., one-half, one-third, etc.) of the clock rate of SYS_CLK. Signal PH_CLK may also be identical to signal SYS_CLK. The clock rate of PH_CLK may have a different phase from the clock rate of SYS_CLK such that a falling edge of the PH_CLK clock signal may correspond to a rising edge of the SYS_CLK clock signal, or so that the PH_CLK and SYS_CLK signals vary by a fraction of a clock cycle.

Controllable clock select circuit 64 may contain a multiplexer 88. Multiplexer 88 may receive clock signal SYS_CLK on conductive path 68 and may receive clock signal PH_CLK on conductive path 66. Multiplexer 88 may output either SYS_CLK or PH_CLK on control path 94. The state of multiplexer 88 may be determined by a digital control signal provided by programmable memory element 20 connected to multiplexer 88 by control path 92. Programmable memory element 20 may be configured by testing equipment 30 on FIG. 1 (e.g., by loading cell 20 with configuration data over path 50). Alternatively, multiplexer 88 may be controlled directly by control circuitry 43 or testing equipment 30 (see, e.g., FIG. 1). Multiplexer 88 outputs clock signal REF_CLK on path 94.

Clock signal REF_CLK may be provided to the input of adjustable pulse width circuitry 60. Adjustable pulse width circuitry 60 may modify the pulse width of REF_CLK. For example, REF_CLK may be a clock signal that is in a high voltage state 50% of the time and in a low voltage state 50% of the time. Adjustable pulse width circuitry 60 may modify REF_CLK to produce a clock signal that is in a high voltage state 10% of the time and in a low voltage state 90% of the time. Adjustable pulse width circuitry 60 may be controlled or programmed to perform any suitable pulse width modification. Adjustable pulse width circuitry 60 may be controlled by applying dynamic control signals to circuitry 60 over path 61 (e.g., signals generated in real time by testing equipment 30). Adjustable pulse width circuitry 60 may also be or programmed by loading programmable elements 20 with configuration data from testing equipment 30. Once loaded, programmable elements 20 may supply static control signals to circuitry 60 via path 61 to adjust circuitry 60. Digital control signals may also be provided to path 61 using control circuitry 43 (see, e.g., FIG. 1). Adjustable pulse width circuitry 60 outputs clock signal CLK1 on conductive path 62.

Adjustable delay chain 52 may receive clock signal CLK1 on conductive path 62 and may shift the phase of clock signal CLK1. Adjustable delay chain 52 may be adjusted or configured to provide any suitable phase shift (time delay) to clock signal CLK1. For example, the phase shift may have a value of 1°, 2°, 45°, 91°, 180°, etc. Adjustable delay chain 52 may receive digital control signals on control path 53 that specifies the degree of phase delay, or no phase delay. The digital control signals may originate from control circuitry 43 on FIG. 1 or testing equipment 30 on FIG. 1. Control signals may also be provided by programmable elements such as programmable elements 20. Adjustable delay chain 52 may output clock signal CLK2 on conductive path 80.

Adjustable positive voltage sag generator 44 may contain adjustable positive voltage sag circuitry 96. Adjustable positive voltage sag circuitry 96 may receive clock signal CLK2 on conductive path 100. Adjustable positive voltage sag circuitry 96 has a terminal 104 that may be connected to positive power supply voltage Vcc terminal 110 on circuit under test 42 and may be connected to positive voltage power supply voltage Vcc-ext on terminal 124. Vcc-ext may have a voltage of, e.g., 1 volt. Adjustable positive voltage sag circuitry 96 may be connected to ground power supply voltage Vss-ext by conductive path 122. Vss-ext may have a voltage of, e.g., 0 volts. Vcc-ext and Vss-ext may be provided by an external source, such as testing equipment 30 on FIG. 1. Adjustable positive voltage sag generator 44 may be controlled by digital control signals on control path 97 that originate from control circuitry 43, testing equipment 30 (see, e.g., FIG. 1), or from programmable elements such as programmable elements 20.

Adjustable ground bounce generator 46 may contain adjustable ground bounce circuitry 89 such as adjustable ground bounce current sink circuitry 86 and adjustable ground bounce current source circuitry 82. Adjustable ground bounce current sink circuitry 86 may receive clock signal CLK2 on path 98. Adjustable ground bounce current sink circuitry 86 may have a path 102 that is connected to Vss terminal 108 of circuit under test 42. Adjustable ground bounce current sink circuitry 86 may be connected to external power supply voltage Vss-ext on path 122. Adjustable ground bounce current sink circuitry 86 may be controlled by digital control signals on control path 87 that originate from control circuitry 43 or testing equipment 30 (see, e.g., FIG. 1), or from programmable elements such as programmable elements 20.

Adjustable ground bounce current source circuitry 82 may receive clock signal CCLK2 on path 81. Adjustable ground bounce current source circuitry 82 may output current on path 106. Path 106 may be connected to Vss terminal 108 on circuit under test 42. Adjustable ground bounce current source circuitry 82 may be controlled or programmed by digital control signals on control path 83 that originate from control circuitry 43 or testing equipment 30 (see, e.g., FIG. 1), or from programmable elements such as programmable elements 20.

Using adjustable circuitry of the type shown in FIG. 2, power supply lines for circuit under test 42 such as body bias paths, positive power supply lines (e.g., Vcc lines), and ground lines may be provided with controlled amounts of positive voltage sag and ground bounce. Voltages Vcc-ext and Vss-ext from external sources on power supply lines may also be varied during the testing of circuit under test 42. For example, a positive power supply voltage may be maintained at 0.9 V during testing instead of a nominal value such as 1.0 V. However, changing only external constant voltage power supply levels may not by itself fully test the ability of circuit under test 42 to function under power supply bounce and sag conditions. For example, circuit under test 42 may function properly when Vcc is 1 volt and may fail to function properly when Vcc is 0.8 V. However, circuit under test 42 may be able to sustain brief 0.3 V sags in Vcc that drop Vcc to 0.7 V momentarily. Test techniques that do not allow voltage sag (and ground bounce) to be measured separately therefore tend to provide inconclusive results.

In the configuration shown in FIG. 2, adjustable voltage sag circuitry 96, adjustable ground bounce current sink circuitry 86, and adjustable ground bounce current source circuitry 82 receive the same clock signal CLK2. Additional adjustable pulse width circuitry 60 and adjustable delay chain circuitry 52 may be provided as shown by dashed lines 70 so that independently adjustable clock signals may be provided to adjustable voltage sag circuitry 96, adjustable ground bounce current sink circuitry 86, and adjustable ground bounce current source circuitry 82.

Additional adjustable voltage sag circuitry 96, adjustable ground bounce circuitry 86, and adjustable current source circuitry 82 may be provided for additional power supply lines that may lead to circuit under test 42, as indicated by dots 72.

Figure 3A:
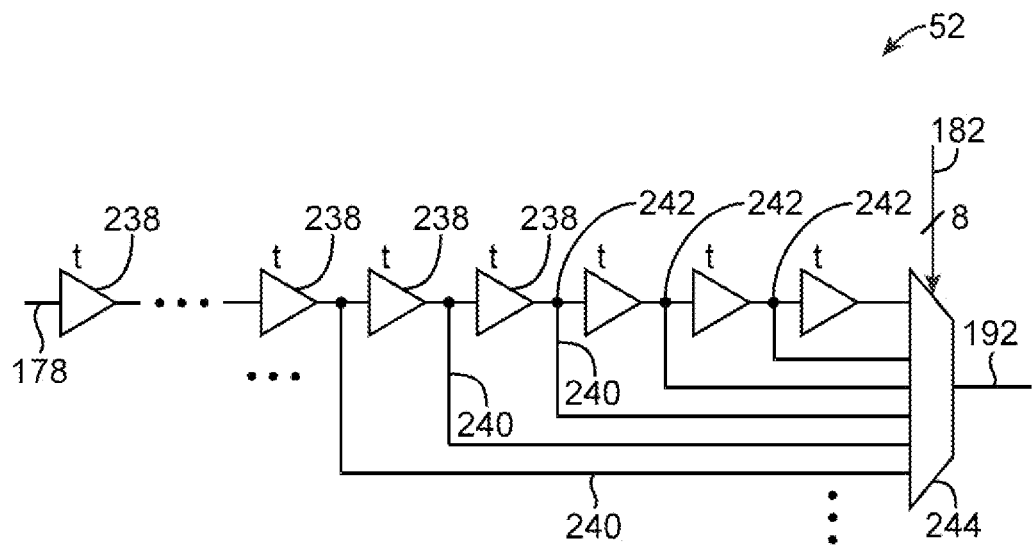
FIG. 3A is a circuit diagram showing adjustable delay chain circuitry in accordance with an embodiment of the present invention.

Illustrative adjustable delay chain circuitry of the type that may be used in implementing adjustable delay chain 52 of FIG. 2 is shown in FIG. 3A. Adjustable delay chain 52 has an input 178 and an output 192. A chain of buffers 238 is used to create a controllable amount of delay for the signals passing between input 178 and output 192. Multiplexer 244 has multiple inputs and a single output. Paths 240 are connected to tap points 242 that lie between respective pairs of buffers 238. Each buffer has an associated delay time τ, so by controlling the location of the tap point 238, the delay of the circuit 180 can be adjusted. If, for example, multiplexer 244 is adjusted so that there are M buffers in the path between input 178 and output 192, the adjustable delay chain 52 will generate a delay of Mτ.

A digital control signal is applied to multiplexer 244 via control input 182. The digital control signal controls which of the multiplexer inputs is electrically connected to its output. The digital control signal may be provided in any suitable format. In the example of FIG. 3A, the digital control signal is provided in the form of an eight-bit signal, providing eight bits of accuracy for adjusting the delay time of the adjustable delay chain 52. The digital control signals may originate from control circuitry 43 on FIG. 1, testing equipment 30 on FIG. 1, or from programmable elements such as programmable elements 20.

Figure 3B:
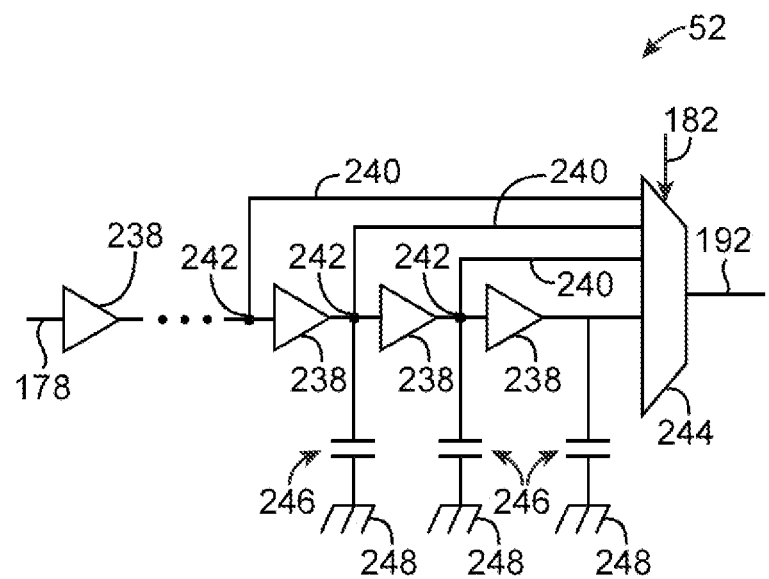
FIG. 3B is a circuit diagram showing adjustable delay chain circuitry in which delay elements have associated capacitors in accordance with an embodiment of the present invention.

If additional delay is needed, illustrative adjustable delay chain circuitry of the type shown FIG. 3B may be used. Adjustable delay chain 52 of FIG. 3B has an input 178 and an output 192. A chain of buffers 238 is used to create a controllable amount of delay for the signals passing between input 178 and output 192. Multiplexer 244 has multiple inputs and a single output. Paths 240 are connected to tap points 242 that lie between respective pairs of buffers 238. Capacitors 246 may be connected between tap points 242 and a ground power supply (e.g. Vss-ext) at ground terminals 248 to provide additional delay. A digital control signal is applied to multiplexer 244 via control input 182. The digital control signal controls which of the multiplexer inputs is electrically connected to its output. The digital control signal may be provided in any suitable format. The digital control signals may originate from control circuitry 43 on FIG. 1 or testing equipment 30 on FIG. 1, or from programmable elements such as programmable elements 20.

Figure 4:
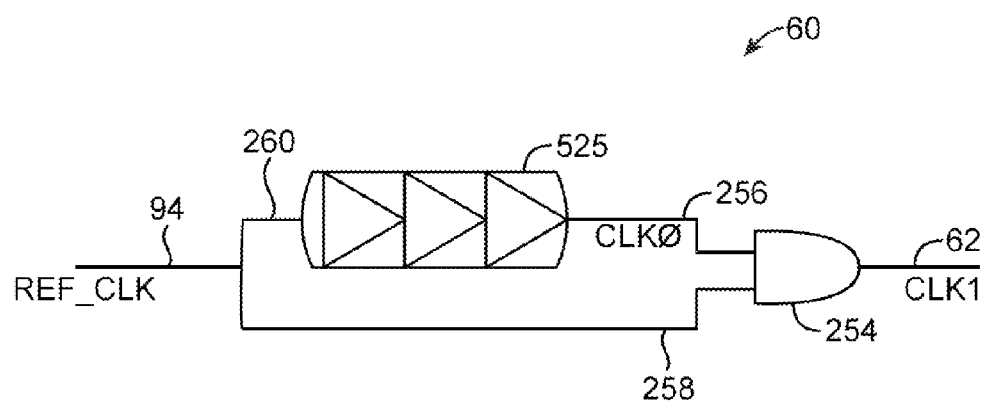
FIG. 4 is a circuit diagram showing adjustable pulse width circuitry in accordance with an embodiment of the present invention.

Illustrative adjustable pulse width circuitry of the type that may be used in implementing adjustable pulse width circuitry 60 of FIG. 2 is shown in FIG. 4. Adjustable pulse width circuitry 60 receives input clock signal REF_CLK on path 94. The signal REK_CLK is conveyed through path 260 to adjustable delay chain 525 (e.g., a delay chain such as delay chain 52 of FIGS. 3A and 3B). Adjustable delay chain 525 adds a phase delay to REF_CLK and outputs this as clock signal CLK0 on path 256. AND gate 254 receives clock signal CLK0 on path 256 from adjustable delay chain 525 and receives clock signal REF_CLK on path 258. AND gate 254 outputs clock signal CLK1 on path 62. Signal CLK1 is only high when both signal CLK0 and signal REF_CLK are high. The width of the clock signal CLK1 can therefore be adjusted by using adjustable delay circuit 525 to make adjustments to the overlap between signals CLK0 and REF_CLK.

Figure 5:
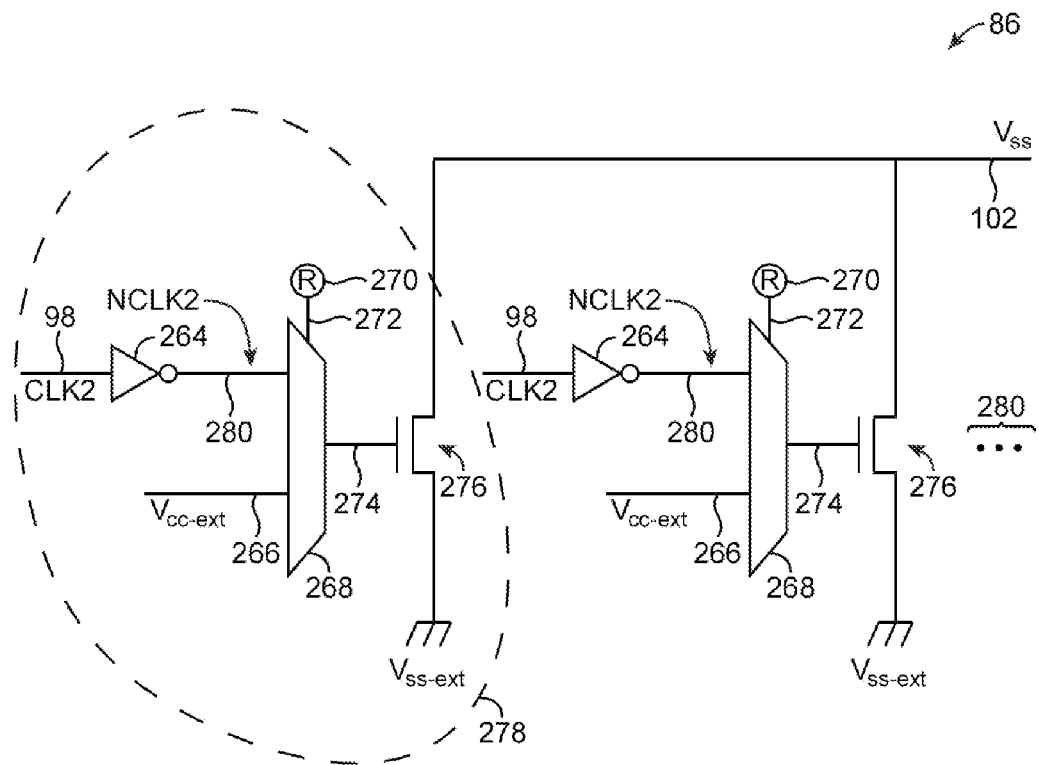
FIG. 5 is a circuit diagram showing adjustable ground bounce current sink circuitry in accordance with an embodiment of the present invention.

Adjustable ground bounce current sink circuitry 86 is shown in FIG. 5. Adjustable ground bounce current sink circuitry 86 may contain a number of adjustable current sinks 278. Each adjustable current sink 278 receives clock signal CLK2 on path 98 and is connected to a path such as path 102 that is connected to Vss terminal 108 of FIG. 1. For each adjustable current sink 278, inverter 264 receives clock signal CLK2 and outputs the inverted clock signal NCLK2 on path 280 that is connected to multiplexer 268. Multiplexer 268 receives a positive power supply voltage such as Vcc-ext on input 266. Multiplexer 268 may receive a digital control signal on path 272 from a programmable element 270. Multiplexer 268 outputs either Vcc-ext or the inverted clock signal NCLK2 on its output 274, which is applied to the gate of n-channel metal-oxide-semiconductor (NMOS) transistor 276. NMOS transistor 276 is connected between ground power supply voltage Vss-ext and Vss path 102 leading to circuit under test 42. Adjustable ground bounce current sink circuitry 86 may contain any number of adjustable current sinks 278 that are connected in parallel, as indicated by dots 280.

During testing, some of the multiplexers 268 may be adjusted to select Vcc-ext, and other may be adjusted to select the outputs of inverters 264. When Vcc-ext is selected, NMOS transistors 276 will be turned on, allowing path 102 to be grounded to Vss-ext. The current sinks 278 containing these transistors may be said to be "inactive" as they are not responsive to clock signal CLK2. When multiplexers 268 are configured to select the output of inverter 264, NMOS transistor 276 will be turned on when CLK2 is low and turned off when CLK2 is high. The current sinks 278 containing these transistors may be said to be "active" as they are responsive to clock signal CLK2. The strength or magnitude of the ground bounce that is produced on Vss line 102 may be determined by the number of current sinks 278 that are in the active state. Adjustable ground bounce current sink circuitry 86 may also be implemented using PMOS transistors, if desired.

Figure 6A:
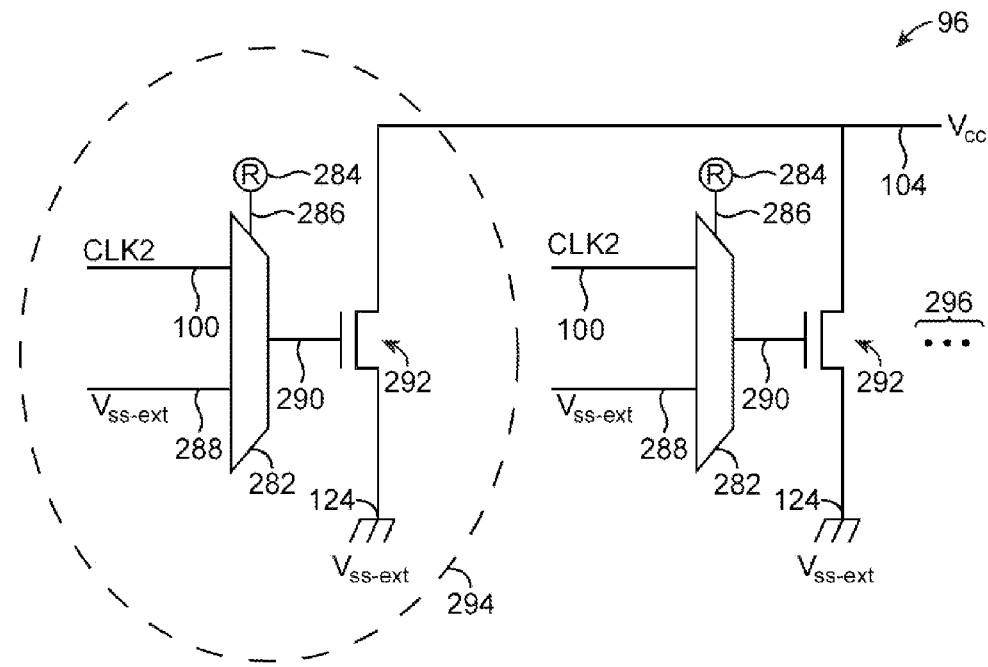
FIG. 6A is a circuit diagram showing adjustable voltage sag circuitry containing NMOS transistors in accordance with an embodiment of the present invention.

Adjustable voltage sag circuitry 96 is shown in FIG. 6A. Adjustable voltage sag circuitry 96 may contain a number of adjustable current sinks 294. Each adjustable current sink 294 receives clock signal CLK2 on path 100 and is connected to the path 104 that is connected to Vcc terminal 110 of FIG. 1 and to Vcc-ext terminal 124. For each adjustable current sink 294, multiplexer 282 receives a ground power supply voltage such as Vss-ext on input 288 and clock signal CLK2 on path 100. Multiplexer 282 may receive a digital control signal on path 286 from a programmable element 284. Multiplexer 282 outputs either Vss-ext or clock signal CLK2 on its output 290. Output 290 is applied to the gate of NMOS transistor 292. NMOS transistor 292 may be connected between ground power supply voltage Vss-ext on terminal 124 and Vcc path 104 leading to circuit under test 42. Adjustable voltage sag circuitry 96 may contain any suitable number of adjustable current sinks 294 that are connected in parallel, as indicated by dots 296.

Some of the multiplexers 282 may be configured to select Vss-ext, and others may be configured to select CLK2. When Vss-ext is selected, NMOS transistors 292 will be turned off, allowing path 104 to assume the voltage Vcc-ext. The current sinks 294 containing these transistors may be said to be "inactive" as they are not responsive to clock signal CLK2. When a given multiplexer 282 is configured to select CLK2, NMOS transistor 292 that receives the output from multiplexer 292 will be turned on when CLK2 is high and turned off when CLK2 is low. The current sinks 294 containing these transistors may be said to be "active" as they are responsive to clock signal CLK2. When CLK2 is high, the active current sinks will ground path 104 to Vss-ext for the duration of the high state, creating a sag in Vcc. The strength (magnitude) of the sag may be determined by the number of current sinks 294 that are in the active state. By controlling multiplexers 282 with control signals, accurate adjustments to the sag magnitude may be made.

Figure 6B:
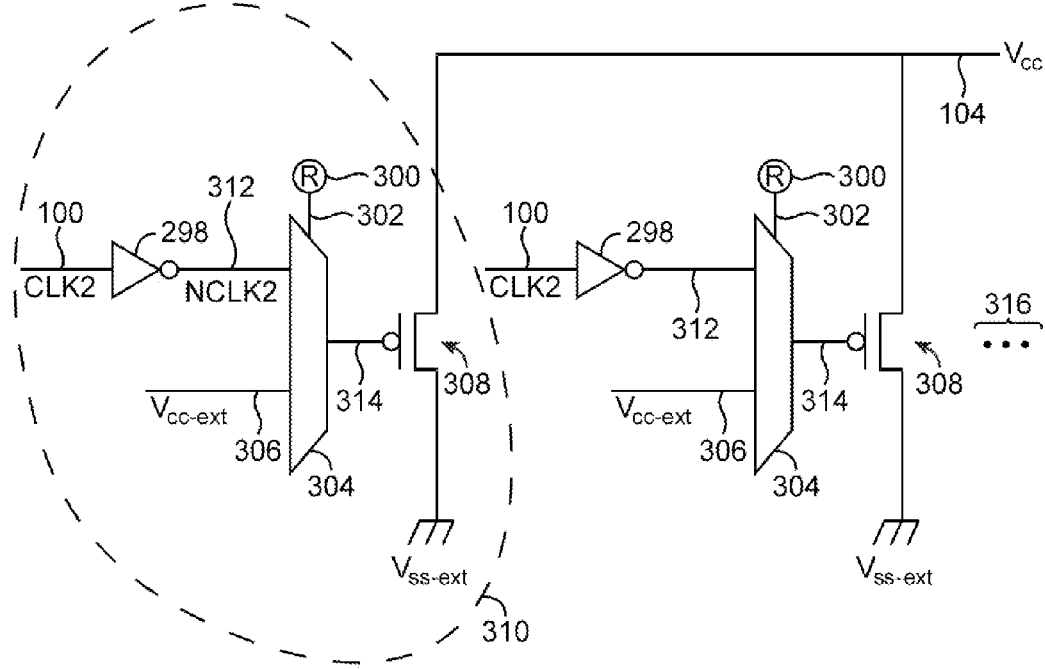
FIG. 6B is a circuit diagram showing adjustable voltage sag circuitry containing PMOS transistors in accordance with an embodiment of the present invention.

Adjustable voltage sag circuitry 96 may also be implemented using PMOS transistors as shown in FIG. 6B. As shown in FIG. 6B, adjustable voltage sag circuitry 96 may contain a number of adjustable current sinks 310. Each adjustable current sink 310 receives clock signal CLK2 on path 100. Path 100 may be connected to inverter 298. Inverter 298 may that output the inverted clock signal NCLK2 on path 312. Each multiplexer 304 receives a positive power supply voltage such as Vcc-ext on input 306 and clock signal NCLK2 on path 312. Multiplexer 304 may receive a digital control signal on path 302 from a programmable element 300. Multiplexer 282 outputs either Vcc-ext or clock signal NCLK2 on its output 314. Output 314 is applied to the gate of PMOS transistor 308. PMOS transistor 308 is connected between ground power supply voltage Vss-ext and Vcc path 104 leading to circuit under test 42. Adjustable voltage sag circuitry 96 of FIG. 6B may contain any suitable number of adjustable current sinks 310 that are connected in parallel, as indicated by dots 316.

Some of the multiplexers 304 may be configured to select Vcc-ext and other multiplexers 304 may be configured to select NCLK2. When Vcc-ext is selected, PMOS transistors 308 will be turned off, allowing path 104 to assume the voltage Vcc-ext. The current sinks 310 containing these transistors may be said to be "inactive" as they are not responsive to clock signal CLK2. When multiplexers 304 are configured to select NCLK2, then PMOS transistor 308 will be turned on when CLK2 is high and turned off when CLK2 is low. The current sinks 310 containing these transistors may be said to be "active" as they are responsive to clock signal CLK2. When CLK2 is high, active current sinks 310 will ground path 104 to Vss-ext for the duration of the high state, creating a sag in Vcc. The magnitude of the sag may be determined by the number of current sinks 310 that are in the active state.

Figure 7:
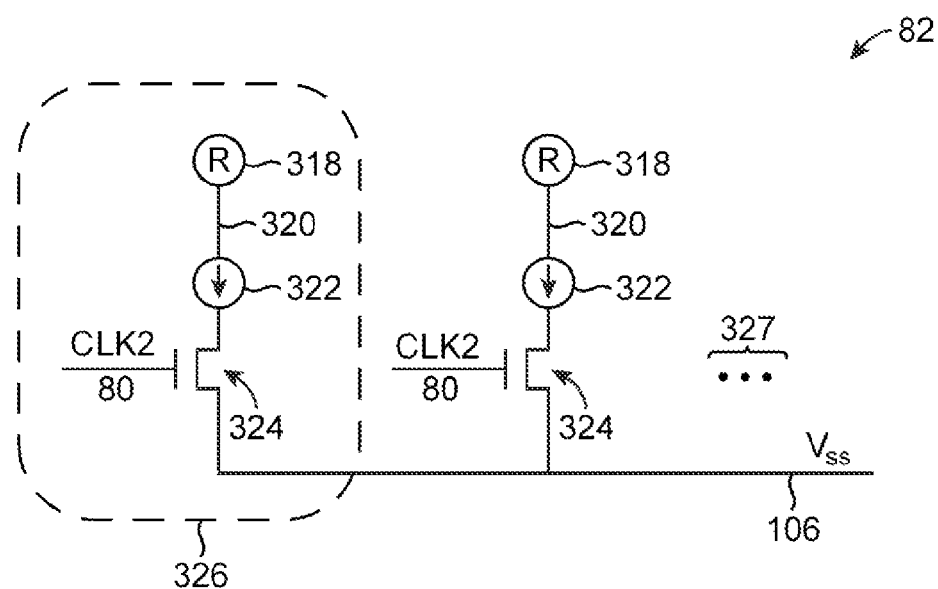
FIG. 7 is a circuit diagram showing adjustable ground bounce current source circuitry in accordance with an embodiment of the present invention.

Illustrative adjustable ground bounce current source circuitry of the type that may be used for adjustable ground bounce current source circuitry 82 of FIG. 2 is shown in FIG. 7. Circuitry 82 may be used in conjunction with adjustable ground bounce current sink circuitry 86 of FIG. 2 to produce a ground bounce of a desired magnitude. Adjustable ground bounce current source circuitry 82 may have a number of adjustable current sources 326 that are connected in parallel. Any number of adjustable current sources 326 may be provided, as indicated by three dots 327. Each unit contains an NMOS transistor 324. Clock signal CLK2 from path 80 is applied to the gate of each NMOS transistor 324. Each NMOS transistor 324 is connected to path 106 and to a respective current source 332. Each current source 332 may be connected to a respective programmable element 318 by a path 320. Each programmable element 318 may provide a digital control signal determining the on or off state of its associated current source 322. When a current source 322 is on, its associated adjustable current sink 326 may be said to be "active" as it is responsive to clock signal CLK2. When a current source 332 is off, its associated adjustable current sink 326 may be said to be "inactive" as it is unresponsive to clock signal CLK2. Active adjustable current sinks 326 supply current to Vss terminal 108 of FIG. 2 via path 106. This may produce a bounce in Vss for the duration of the high state of clock signal CLK2. The strength or magnitude of the bounce may be determined by the number of adjustable current sinks that are in the active state. Active current sinks 326 in adjustable ground bounce current source circuitry 82 may be used to supplement the amount of ground bounce produced by adjustable ground bounce current sink circuitry 86.

Adjustable voltage sag generators and adjustable ground bounce generators may be used for circuit blocks that make up any suitable types of integrated circuits such as microprocessors, digital signal processors, or application specific integrated circuits. The integrated circuits may also be programmable integrated circuits. Examples of programmable integrated circuits include programmable logic devices (also sometimes referred to as field-programmable gate arrays) and integrated circuits that have programmable circuitry, but which are not typically referred to as programmable logic devices, such as microprocessors, digital signal processors, or application specific integrated circuits that contain programmable circuitry.

Figure 8:
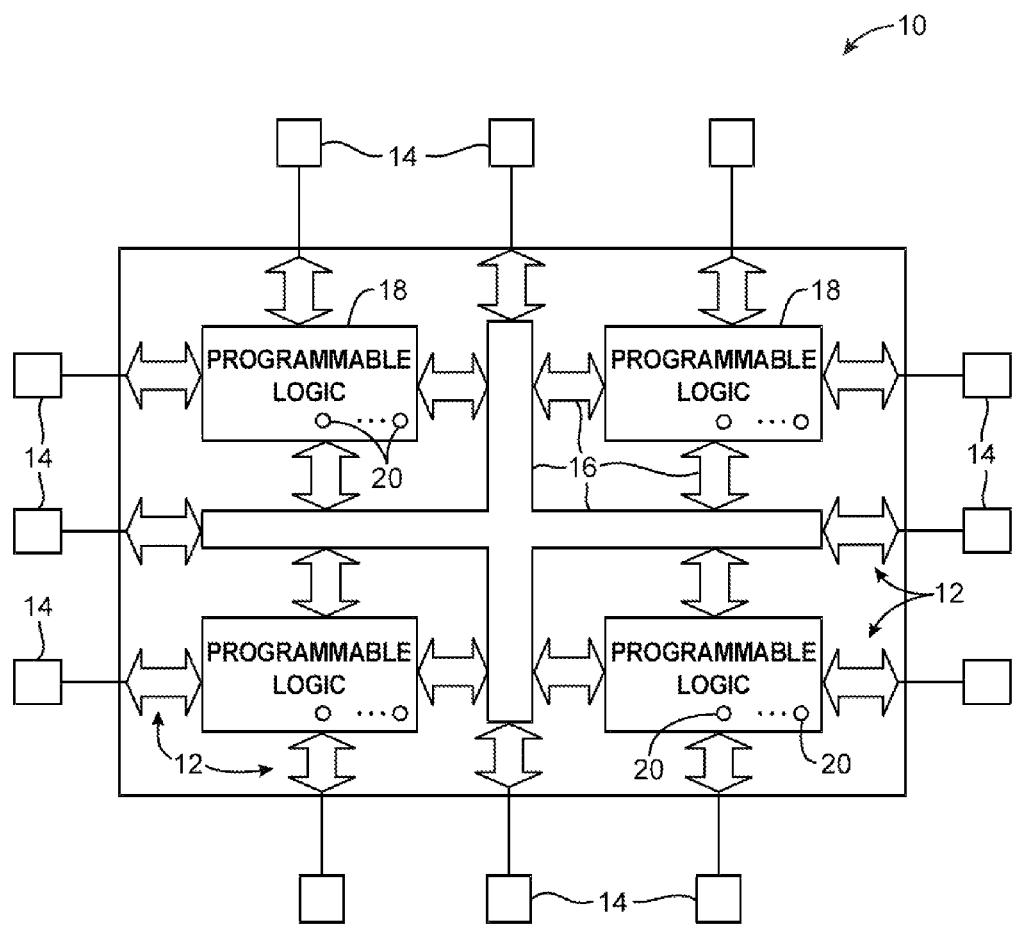
FIG. 8 is a circuit diagram showing an integrated circuit in accordance with an embodiment of the present invention.

An illustrative programmable logic device 10 is shown in FIG. 8. Programmable logic device 10 has input-output circuitry 12 for driving signals off of device 10 and for receiving signals from other devices via input-output pins 14. Interconnection resources 16 such as global and local vertical and horizontal conductive lines and buses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 10.

Programmable logic device 10 contains programmable elements 20 such as random-access memory cells and non-volatile elements such as polysilicon fuses. Programmable elements 20 (e.g., volatile elements such as random-access memory cells) can be loaded with configuration data (also called programming data) using pins 14 and input-output circuitry 12. The programmable elements each provide a corresponding static control output signal that controls the state of an associated logic component in programmable logic 18. The programmable element output signals are typically used to control the gates of metal-oxide-semiconductor (MOS) transistors. Most of these transistors are generally n-channel metal-oxide-semiconductor (NMOS) pass transistors in programmable components such as multiplexers, look-up tables, logic arrays, AND, OR, NAND, and NOR logic gates, etc. When a programmable element output is high, the pass transistor controlled by that programmable element is turned on and passes logic signals from its input to its output. When the programmable element output is low, the pass transistor is turned off and does not pass logic signals.

The programmable elements may be loaded from any suitable source. In a typical arrangement in which device 10 is used in a system, the programmable elements are loaded from an external erasable-programmable read-only memory and control chip called a configuration device via pins 14 and input-output circuitry 12. During testing, a test chip version of device 10 may be loaded with configuration data by testing equipment 30.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

If circuit under test 42 (see, e.g., FIGS. 1 and 2) contains programmable logic circuitry that may be used in a programmable logic device, then control paths 112 (see, e.g., FIG. 2) may be used to configure the logic of circuit under test 42. Different logic arrangements may be used during testing. For example, testing equipment 30 may load a series of different sets of test configuration data that reconfigure circuit under test 42 to implement a variety of test circuits, each of which can then be tested with various test vectors at various power supply voltages and with adjustable amounts of voltage sag and ground bounce. If desired, optional BIST 126 (see, e.g., FIG. 2) may be used to facilitate testing circuit under test 42.

Figure 9:
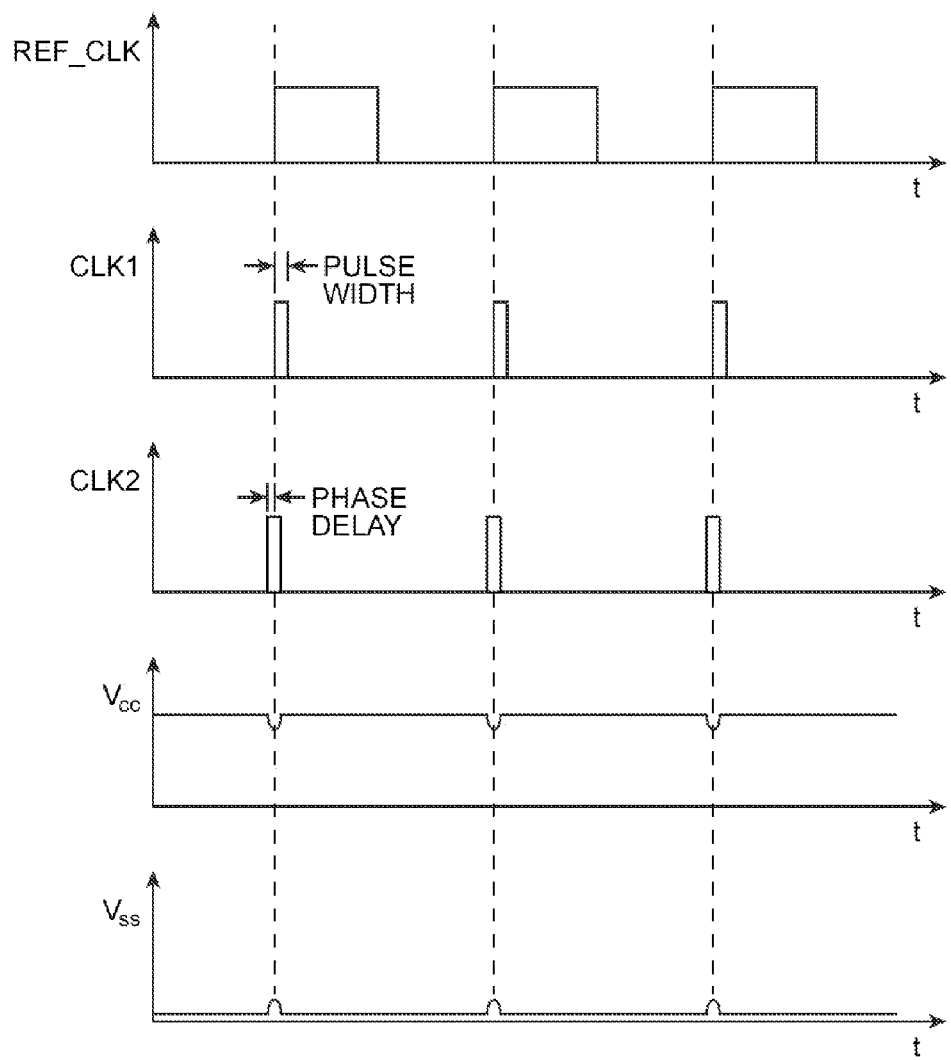
FIG. 9 is a diagram showing clock signals and voltage sag and ground bounce effects that may be produced using adjustable positive power supply voltage sag and ground bounce circuitry in accordance with an embodiment of the present invention.

FIG. 9 shows how clock signals may be modified while passing through adjustable pulse width circuitry 60 and adjustable delay chain circuitry 52 (see, e.g., FIG. 2). The first trace of FIG. 9 shows clock signal REF_CLK (see, e.g., FIG. 2). Signal REF_CLK may be the same as the signal SYS_CLK that is supplied to circuit under test 42 or signal REF_CLK may be different, such as a multiple or fraction of SYS_CLK. REF_CLK is shown as having a 50% duty cycle, so that REF_CLK is 50% in a high voltage state and 50% in a low voltage state, although REF_CLK could have other duty cycle configurations if desired. After passing through adjustable pulse width circuitry 60, the clock signal may resemble that of clock signal CLK1 as shown in the second trace of FIG. 9. Clock signal CLK1 spends a small amount of time in the high state (in this example). The clock signal CLK1 may then be sent through the adjustable delay chain circuitry 52. The resulting output clock signal may resemble CLK2 in the third trace. The phase delay for CLK2 may be adjusted to any desired phase delay magnitude. For example, a small phase delay may be imposed, as shown in the third trace of FIG. 9. If desired, a larger phase delay such as half of a cycle so as to coincide with the falling edge of clock signal REF_CLK may be imposed (as an example).

Adjustable voltage sag circuitry 96 (see, e.g., FIG. 2) may receive clock signal CLK2 and may produce a corresponding voltage sag pattern on power supply voltage Vcc such as that shown in the fourth trace of FIG. 9. For the majority of the time, Vcc may have a constant value (e.g. 1 volt). There is a downward sag in Vcc corresponding to the high states of CLK2. The width and phase position of the sag is determined by the width and phase of the pulses in clock signal CLK2. The magnitude of the sag is determined by the setting of adjustable voltage sag circuitry 96. The magnitude of the sag can be increased by setting more current sinks 294 and 310 in the active state (see, e.g., FIGS. 6A and 6B).

If CLK2 is provided to adjustable ground bounce current sink circuitry 86 and/or adjustable ground bounce current source circuitry 82, then the ground voltage Vss may have a bounce as shown in the fifth trace of FIG. 9. Ground voltage Vss may be at a constant voltage (e.g. 0 volts) for the majority of the time. There is an upward bounce that corresponds with the high state of clock signal CLK2. The width and phase position of the bounce is determined by CLK2. The magnitude of the bounce is determined by the number of current sources 326 that are active in adjustable ground bounce current source circuitry 82 (see, e.g., FIG. 7), and the number of current sinks 278 that are active in adjustable ground bounce circuitry 86 (see, e.g., FIG. 5). If more current sources 326 and current sinks 278 are active, then a greater bounce may be produced with each high state of CLK2. If desired, some current sources 326 may be active while all current sinks 278 are inactive, or vice versa. Although the example of FIG. 9 illustrates a situation in which ground bounce and voltage sag are produced from the same clock signal, ground bounce and voltage sag effects may, in general, be controlled differently. Moreover, adjustable phase delay circuits may be used to adjust the position of the voltage sag and ground bounce events to any position relative to the rising and falling edges of system clock SYS_CLK. This allows circuit under test 42 to be tested thoroughly under a variety of conditions.

Figure 10:
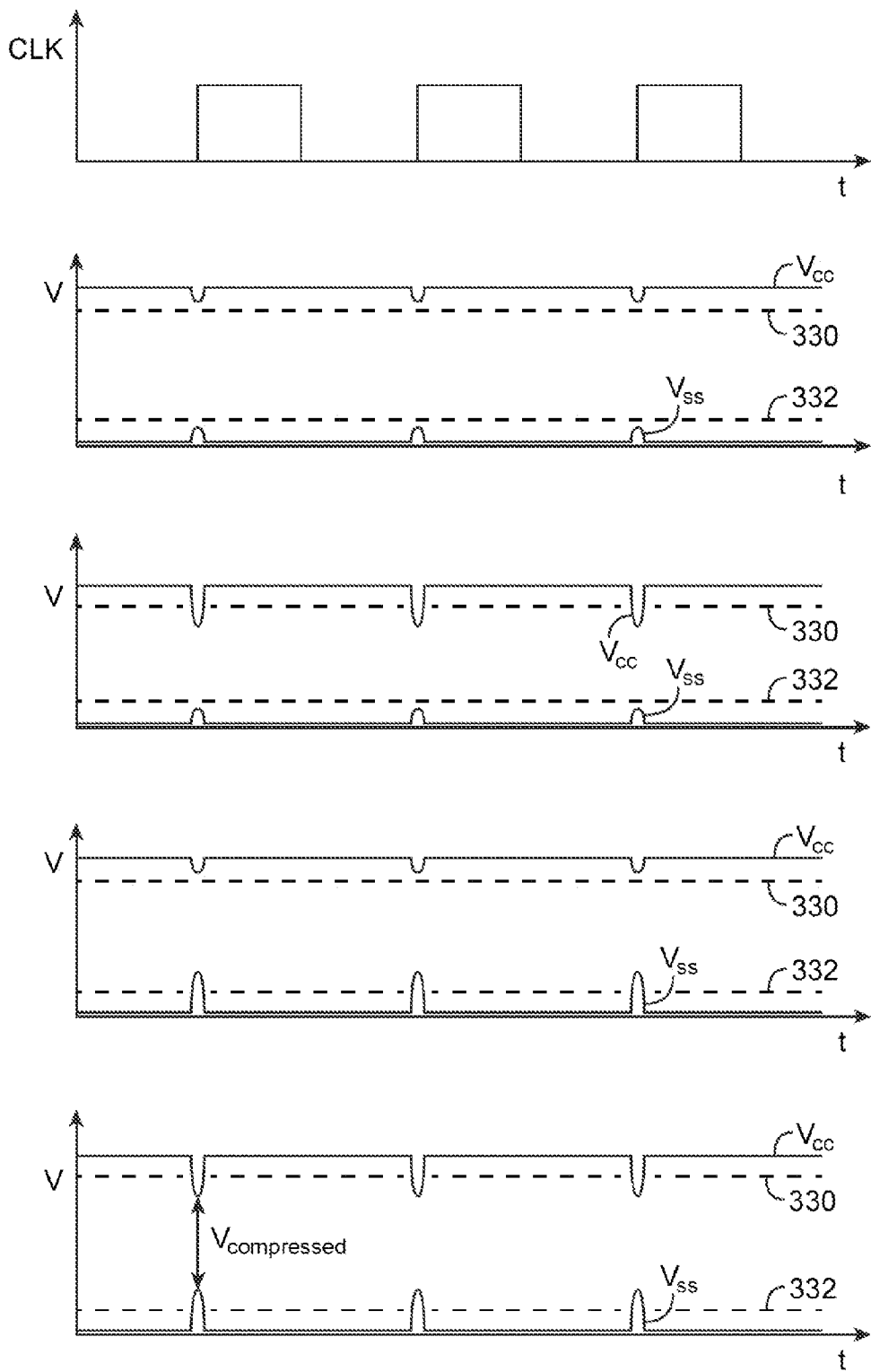
FIG. 10 is a diagram showing how magnitudes of positive power supply voltage sag and ground power supply voltage bounce may be adjusted using adjustable positive power supply voltage sag and ground bounce circuitry in accordance with an embodiment of the present invention.

FIG. 10 shows samples of power supply voltages containing sags and bounces that may be used to test circuit under test 42. The first trace shows a clock signal CLK that may be supplied to circuit under test 42. The second trace shows positive power supply voltage Vcc containing sags at the rising edge of clock signal CLK, and ground power supply voltage Vss containing bounces at the rising edge of clock signal CLK. There may be a Vcc sag limit indicated by dashed line 330, such that the performance of circuit under test 42 may decrease (e.g., circuit under test 42 may fail) if Vcc sags fall below this limit. There may be a Vss bounce limit indicated by dashed line 332 such that the performance of circuit under test 42 may decrease (e.g., circuit under test 42 may fail to operate satisfactorily) if bounces in Vss bounce higher than this limit.

The third trace in FIG. 10 shows how the Vcc sag level may be selectively adjusted to probe Vcc sag limit 330 without generating excessive ground bounce. Additional current sinks 294 and 310 in adjustable voltage sag circuitry 96 (see, e.g., FIGS. 6A and 6B) may be activated to increase the magnitude of the sag in Vcc.

The fourth trace in FIG. 10 shows how the amount of ground bounce may be selectively adjusted to probe Vss bounce limit 332 without generating excessive Vcc sag. Additional current sources 326 in adjustable ground bounce current source circuitry 82 (see, e.g., FIG. 7) and additional current sinks 278 in adjustable ground bounce current sink circuitry 86 (see, e.g., FIG. 5) may be activated to increase the magnitude of the bounce in Vss.

The fifth trace in FIG. 10 shows how the magnitude of Vcc sag may be increased to probe Vcc sag limit 330 at the same time that the magnitude of Vss bounce may be increased to probe Vss bounce limit 332. As marked in the fifth trace of FIG. 10, the voltage differential at the time of sag and bounce may be known as a compressed voltage Vcompressed. The production of sag and bounce in a power supply may be known as voltage compression.

Figure 11:
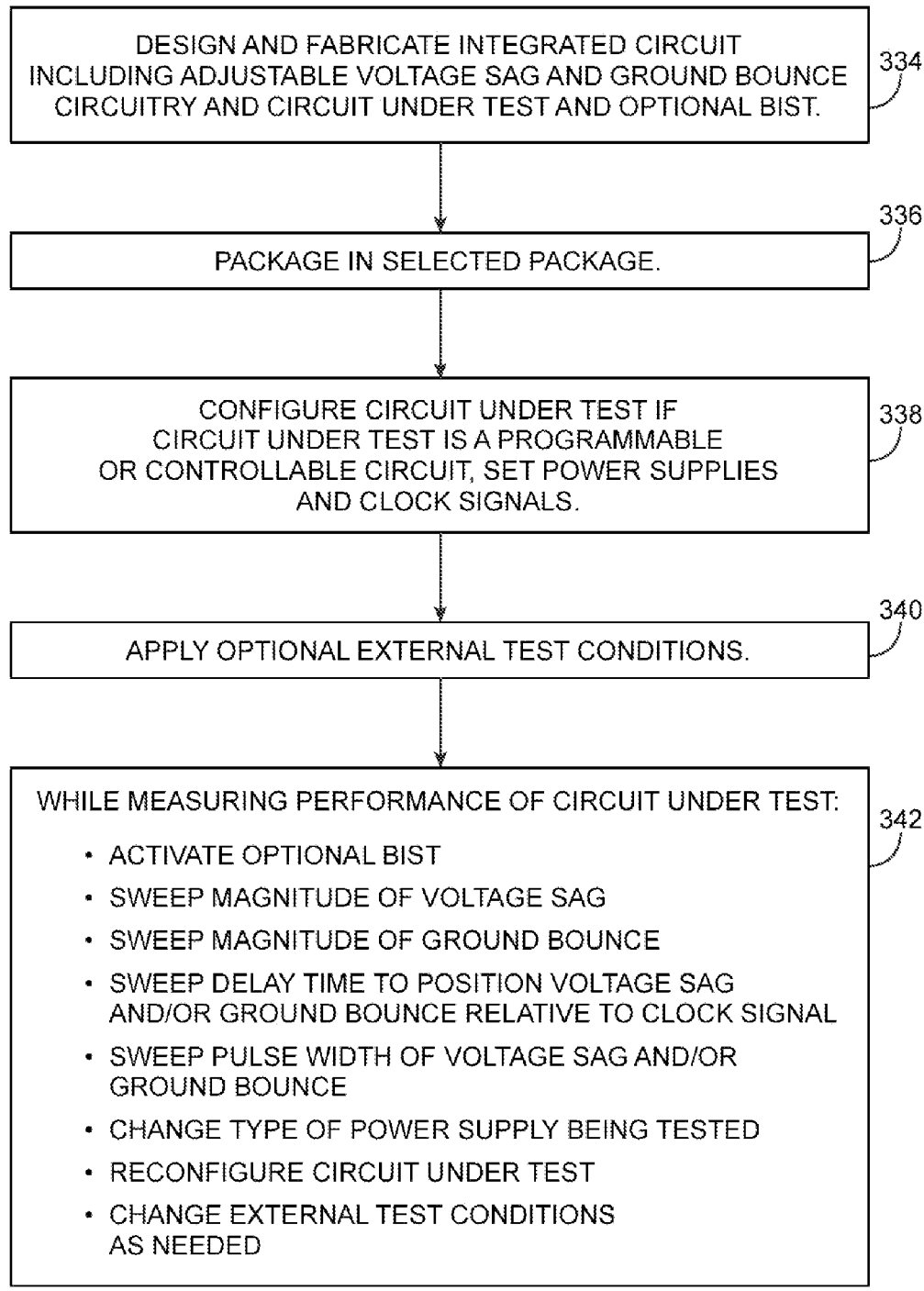
FIG. 11 is a flowchart showing how adjustable positive power supply voltage sag and ground bounce circuitry may be used to test a circuit under test in accordance with an embodiment of the present invention.

To perform power supply sag and bounce testing, steps such as the illustrative steps of FIG. 11 may be performed. An integrated circuit containing a circuit under test (CUT) 42 and adjustable sag and bounce circuitry may be designed and fabricated at step 334. The integrated circuit may include optional built in self test (BIST) circuitry. This integrated circuit may be a special test integrated circuit that is not put into use or sent to customers, or it may be an integrated circuit that is put into use or sent to customers after its adjustable sag and bounce circuitry has been deactivated.

The integrated circuit containing circuit under test 42 may be packaged in any suitable packaging as indicated by step 336 of FIG. 11. The package could be a flip chip package or a wire bond package. If desired, the integrated circuit may be packaged in a flip chip package and adjustable positive voltage sag generator and adjustable ground bounce generators may be used to mimic the greater positive voltage sag and ground bounce conditions of a wire bond package.

If the circuit under test contains programmable logic, then suitable configuration data for programming the logic may be loaded into the circuit under test in step 338 (e.g., using testing equipment 30). The circuit under test may also be adjusted by using testing equipment 30 to vary control signals to its inputs. Power supplies and clock signals that supply power to the integrated circuit may also be configured by testing equipment 30.

External test conditions such as temperature, humidity, and radiation may also be varied by equipment 30 while power supply sag and bounce testing is performed, as indicated by step 340 of FIG. 11. With one suitable arrangement, the integrated circuit and associated test equipment may be designed to be compact so as to fit into small experimental locations, such as for radiation testing.

External measuring equipment may be used to measure the performance of the circuit under test in step 342. Optional BIST circuitry may also be used. During the test, the magnitudes of positive voltage sag and ground bounce may be varied to ascertain the operating limits of the circuit under test. The magnitudes of the positive voltage sag and ground bounce events that are produced may be swept together or separately.

The phase of positive voltage sag and ground bounce that are produced may be swept in order to position positive voltage sag and ground bounce relative to the rising edge, falling edge, or middle portion of a clock signal. Positioning positive voltage sag and ground bounce at the falling edge of a clock signal may be advantageous for investigating a design containing many negative edge triggered logic circuits. On a typical integrated circuit, components that nominally switch simultaneously may not all switch at once due to the time it takes for a clock signal to travel to all portions of the integrated circuit. Adjusting the phase delay of positive voltage sag and ground bounce by small amounts may mimic the behavior of such a typical integrated circuit. The pulse width of positive voltage sag and ground bounce may be swept to test the effects of more sustained sag and bounce events on the circuit under test.

The voltage on power supply lines such as the positive and ground power supply lines may also be varied. For example, a Vcc voltage of 0.8 V may be supplied to the integrated circuit instead of 1.0 V while varying positive voltage sag and/or ground bounce. Positive voltage sag and ground bounce may be applied to any number of power supply lines such as body bias lines power supply. If the circuit under test contains programmable logic, the logic of the circuit under test may be reconfigured by testing equipment 30 to test different logic configurations.

The foregoing is merely illustrative of the principles of this invention and various modifications can be made by those skilled in the art without departing from the scope and spirit of the invention.

What is claimed is:

1. An integrated circuit comprising:
   a circuit under test that is powered using a positive power supply voltage; and
   adjustable positive power supply voltage sag circuitry that produces an adjustable voltage sag on the positive power supply voltage, wherein the adjustable positive power supply voltage sag circuitry includes at least one current sink.

2. The integrated circuit defined in claim 1, wherein the adjustable voltage sag has an associated magnitude, and wherein the adjustable positive power supply voltage sag circuitry comprises:
   adjustable current sink circuitry that adjusts the magnitude of the adjustable voltage sag in response to control signals, wherein the adjustable current sink circuitry includes the at least one current sink.

3. The integrated circuit defined in claim 2, wherein the control signals comprise static control signals, and wherein the integrated circuit further comprises:
   programmable elements that provide the static control signals to the adjustable current sink circuitry to adjust the magnitude of the adjustable voltage sag.

4. The integrated circuit defined in claim 3, wherein the integrated circuit comprises a positive power supply voltage terminal and a ground power supply voltage terminal, wherein the adjustable current sink circuitry comprises a plurality of individually controlled current sinks including the at least one current sink, and wherein each current sink comprises:
   a first terminal that is connected to the positive power supply voltage terminal; and
   a second terminal that is that is connected to the ground power supply voltage terminal.

5. The integrated circuit defined in claim 1, wherein the adjustable voltage sag has an associated phase delay and wherein the integrated circuit further comprises:
   adjustable phase delay circuitry that controls the associated phase delay in response to control signals.

6. The integrated circuit defined in claim 5, wherein the control signals comprise static control signals, and wherein the integrated circuit further comprises:
   programmable elements that provide the static control signals to the adjustable phase delay circuitry to adjust the associated phase delay.

7. The integrated circuit defined in claim 6, wherein the adjustable phase delay circuitry comprises:
   a chain of buffers; and
   a multiplexer that has plurality of inputs, wherein the inputs are connected to tap points in the chain of buffers.

8. The integrated circuit defined in claim 1, wherein the adjustable voltage sag has an associated pulse width, wherein the integrated circuit further comprises:
   adjustable pulse width circuitry that controls the associated pulse width in response to control signals.

9. The integrated circuit defined in claim 8, wherein the control signals comprise static control signals, and wherein the integrated circuit further comprises:
   programmable elements that provide the static control signals to the adjustable pulse width circuitry to adjust the associated pulse width.

10. The integrated circuit defined in claim 9, wherein the adjustable pulse width circuitry comprises:
    an input terminal;
    adjustable phase delay circuitry, wherein the adjustable phase delay circuitry comprises buffers and wherein the adjustable phase delay circuitry is connected to the input terminal; and
    a logic gate, wherein the logic gate comprises a first input terminal that is connected to the input terminal and a second input terminal that is connected to the adjustable phase delay circuitry to receive output from the adjustable phase delay circuitry.

11. The integrated circuit defined in claim 1, wherein the circuit under test is powered using a ground power supply voltage and wherein the integrated circuit comprises:
    adjustable ground bounce circuitry that produces an adjustable ground bounce on the ground power supply voltage.

12. The integrated circuit defined in claim 11, wherein the adjustable ground bounce has an associated magnitude, and wherein the adjustable ground bounce circuitry comprises:
    adjustable ground bounce current sink circuitry that adjusts the magnitude of the adjustable ground bounce in response to control signals; and
    adjustable ground bounce current source circuitry that adjusts the magnitude of the adjustable ground bounce in response to control signals.

13. The integrated circuit defined in claim 12, wherein the control signals comprise static control signals, and wherein the integrated circuit further comprises:
    programmable elements that provide the static control signals to the adjustable ground bounce circuitry to adjust the magnitude of the adjustable ground bounce.

14. An integrated circuit powered using a positive power supply voltage and a ground power supply voltage, comprising:
    adjustable ground bounce circuitry that produces an adjustable amount of ground bounce on the ground power supply voltage, wherein the adjustable ground bounce circuitry includes at least one current sink.

15. The integrated circuit defined in claim 14 further comprising programmable circuitry for adjusting a pulse width of the adjustable amount of ground bounce.

16. The integrated circuit defined in claim 15 further comprising circuitry for adjusting phase delay and magnitude for the adjustable amount of ground bounce.

17. A method for testing an integrated circuit containing an adjustable positive power supply voltage sag generator, an adjustable ground bounce generator, and a circuit under test, comprising:

during testing, generating positive power supply voltage sags with the adjustable positive power supply voltage sag generator and generating adjustable ground bounces with the adjustable ground bounce generator; and measuring performance of the circuit under test when the circuit under test is supplied with a positive power supply voltage containing the positive power supply voltage sags and a ground power supply voltage containing the adjustable ground bounces.

18. The method defined in claim 17 further comprising:

measuring the performance of the circuit under test while adjusting a magnitude of the positive power supply voltage sags using the adjustable positive power supply voltage sag generator and while adjusting a magnitude of the ground bounces using the adjustable ground bounce generator.

19. The method defined in claim 17 further comprising:

measuring the performance of the circuit under test while using the adjustable positive power supply voltage sag generator to adjust a phase delay of the positive power supply voltage sags and while using the adjustable ground bounce generator to adjust a phase delay of the adjustable ground bounces.

20. The method defined in claim 17 further comprising:

measuring the performance of the circuit under test while using the adjustable positive power supply voltage sag generator to adjust a pulse width of the positive power supply voltage sags and while using the adjustable ground bounce generator to adjust a pulse width of the adjustable ground bounces.

21. The method defined in claim 17, wherein the circuit under test comprises programmable logic, the method further comprising:

measuring the performance of the circuit under test when the circuit under test is loaded with configuration data.

* * * * *